United States Patent [19]

Baillie

[11] 4,435,498
[45] Mar. 6, 1984

[54] MANUFACTURE OF WAFER-SCALE INTEGRATED CIRCUITS

[75] Inventor: Alan G. Baillie, Stirling, Scotland

[73] Assignee: Burroughs Corporation, Detroit, Mich.

[21] Appl. No.: 328,339

[22] Filed: Dec. 7, 1981

[51] Int. Cl.³ .................................................. G03C 5/00
[52] U.S. Cl. .................................... 430/318; 156/659.1
[58] Field of Search ...................... 430/318; 156/659.1; 148/1.5, 187; 29/571

[56] References Cited

U.S. PATENT DOCUMENTS 3,385,702  5/1968  Koehler .............................. 430/318
3,649,392  3/1972  Schneck .............................. 430/318

*Primary Examiner*—Won H. Louie, Jr.
*Attorney, Agent, or Firm*—David G. Rasmussen; Kevin R. Peterson; Edmund M. Chung

[57] ABSTRACT

In the course of manufacturing a wafer-scale integrated circuit, the metalization for interconnection both within each cell and between cells is achieved by the etching of a single metal layer, photoresist being deposited on the layer and exposed using a step-and-repeat mask for those areas within each cell and using a whole-wafer reticle mask for the areas of interconnection between the cells.

1 Claim, 5 Drawing Figures

MANUFACTURE OF WAFER-SCALE INTEGRATED CIRCUITS

BACKGROUND OF THE INVENTION

1. Field of the Invention

The present invention relates to a method for providing metallization patterns on a very-large scale or wafer-scale integrated circuit.

2. The Prior Art

A wafer-scale integrated circuit can be defined in a whole wafer of active circuits mounted in a single package. A large number of usually identical, separately functional integrated circuits are provided on a single semiconducting wafer. Certain electrical connections known as global connections are common to all or most of the integrated circuits. Power connections and connections carrying common control signals are suitable subjects for global treatment. Any signal which is provided simulataneously to a substantial proportion of the integrated circuits on the wafer is global. The extensiveness of the distribution of global signals necessitates their distribution via a network of metal conductor paths to minimise losses.

In the present state-of-the-art there exist two methods for making the metallization pattern required for the manufacture of a wafer-scale integrated circuit. In a first method one mask is used which is common to all of the individual integrated circuits on the wafer. The mask is used first in one position on the wafer, then in another, to mark out on the wafer a repetetive plurality of metal areas on the wafer, each area corresponding to the metallization pattern of an individual integrated circuit. This process is known as "step and repeat", that is the same pattern being repeated at controlled intervals across the wafer. The metal areas for each of the integrated circuits can include Global lines, in which case the disposition and necessary repetitive symmetry of these connections place severe limitations on the manner in which the Global connections can be made. It is more usually the case that the metal areas for the individual integrated circuits are laid down as a first pattern of metallization, and interconnections between the individual integrated circuits are laid down as a second pattern of metallization. This necessitates a cost and time consuming two pass metallization process.

In a second method a reticle can be used, that is, a mask which covers all or most of the area of the wafer. The metalisation pattern both within each of the integrated circuits on the wafer and therebetween is laid down as a single process.

In this second method a first problem arises concerning the positional accuracy which can be defined by a reticle. While the step-and-repeat method currently allows for the definition of position on the wafer and consequent control of conductor dimensions to within around 2 micrometers, the use of a reticle, which can be generated only as accurately as the pattern generator which creates it, allows only that a position on the wafer be defined with an accuracy of the order of 10 micrometers. This five-to-one loss of definition in conductor positions and dimensions necessitates that the individual integrated circuits on the wafer be much more loosely packed with components than might otherwise be possible using a step-and-repeat metalising masking process. The loss of Areal efficiency so encountered makes the use of a single reticle metallization masking process for a wafer-scale integrated circuit most unattractive.

A second problem arises with the second method in that, while it is relatively easy to align a step-and-repeat small area mask over a wafer, it is extremely difficult and time consuming and requires much skill to so align a reticle which bears individual circuit detail.

SUMMARY OF THE INVENTION

A wafer-scale integrated circuit is hereinafter defined as an integrated circuit comprising a plurality of identical integrated circuit areas on a common substrate each of said areas being provided with a local pattern of electrically conductive metallization, said area of local metallization being interconnected with other such areas for simultaneous operation by a global pattern of interconnection.

A step-and-repeat masking process is hereinafter defined as a masking process which uses the same mask in a plurality of positions on a substrate.

A reticle masking process is hereinafter defined as a masking process using a mask which covers the entire surface of a substrate.

The present invention consists in a method for metallizing a wafer-scale integrated circuit including the etching of a common metallic layer to leave, as the local metallization, areas defined by a step-and-repeat masking process and to leave, as the global metallization, areas defined by a reticle masking process.

BRIEF DESCRIPTION OF THE PREFERRED EMBODIMENT

In a preferred embodiment a preferably silicon whole-wafer integrated circuit which has been fabricated to the point of completion of diffusion, has coated thereover a layer of metal which makes ohmic contact where required with each one out of a plurality of areas of diffusion thereon. The meatl is preferably coated with a layer of photoresist which preferably becomes etch-resistant subsequently to being exposed to light. The areas of diffusion are preferably all identical to one another, in which case the photoresist over the areas of diffusion is exposed using a step-and-repeat mask which is identical for all of the diffusion areas. The photoresist intermediate between the diffused areas is referably exposed to light using a single, reticle mask covering the whole area of the wafer and defining metallization between the areas. Subsequently to both exposures, the photoresist is preferably cured and the unexposed and uncured part thereof washed away. Thereafter the metal which is not protected by cured photoresist is preferably etched away to leave a pattern of metallization on the wafer.

The invention is further explained, by way of an example, by the following description in conjunction with the appended drawings, in which:

DETAILED DESCRIPTION OF THE PREFERRED EMBODIMENT

Figure 1:
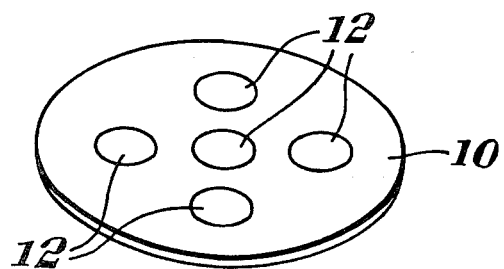
FIG. 1 shows a diffused wafer substrate prior to metallization.

FIG. 1 shows a silicon wafer 10 whereon have been diffused a plurality of identical areas 12 which require only the addition of metallization to become functionable integrated circuits. The areas 12 are further to be connected to one another and to the outside world to form a wafer-scale integrated circuit whereon each of the areas 12 is simultaneously operable, dependently upon being capable of passing a functional test, as part of a larger circuit.

Figure 2:
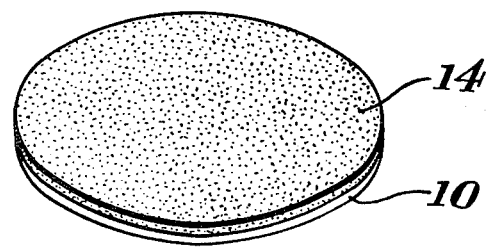
FIG. 2 shows the substrate of FIG. 1 coated in metal.

FIG. 2 shows the wafer 10 of FIG. 1 coated in a metallic layer 14. This is done in the normal way well known in the art of integrated circuit fabrication. The metal is aluminium, but could equally well be any other which is so usable. The metal layer 14 makes ohmic contact with those parts of the diffused areas 12 which are to be electrically connected to any other point by metallization.

Figure 3:
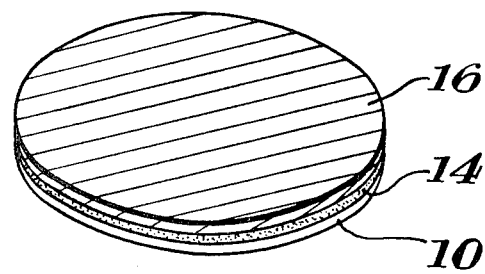
FIG. 3 shows the metal-coated substrate of FIG. 2 further coated in photoresist.

FIG. 3 shows the metal coated 14 wafer 10 of FIG. 2 further coated in a photoresist layer 16. The photoresist is of a type which can be cured only when light has been incident thereon.

Figure 4:
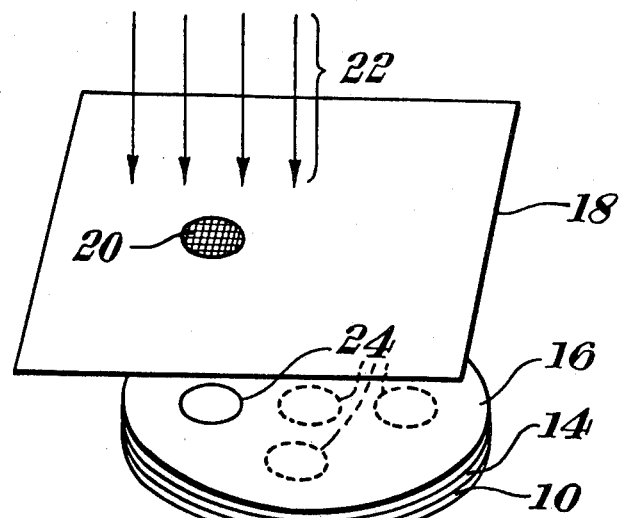
FIG. 4 shows the exposing of the photoresist for local metallization using a step-and-repeat mask.

FIG. 4 shows the exposure of the local metallization of the wafer scale integrated circuit.

A step and repeat mask 18 whereon there is only one area of transparency 20 bearing the pattern for the local metallisation of the areas 12, is moved across the surface of the photoresist 16 on the metal 14 and wafer 10 and stopped in conjunction with the operation of a lightsource 22 to provide, over each of the diffused areas 12, an area of exposed photoresist 24 corresponding to the metallization pattern which is required on the areas 12.

Figure 5:
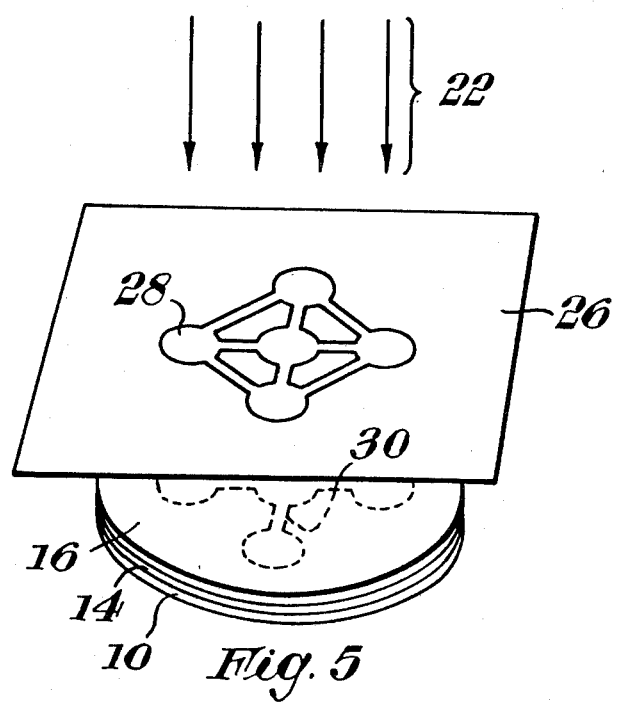
FIG. 5 shows the exposing of the photoresist for for global metallization using a reticle masking process.

FIG. 5 shows the exposure of the photoresist 16, subsequently to the step-and-repeat exposure for the local metallization, to the light pattern required for the Global metallization.

A reticle mask 26 covers the entire area of the wafer 10. After the reticle mask 26 has been positioned, the lightsource 22 is operated to expose areas of Global lines 30 on the photoresist 16 in response to the Global metalisation defining areas of transparency 28 on the reticle mask 26.

The photoresist 16 having thus been twice exposed, once for the local metalisation and once for the Global metalisation, using a step-and-repeat optical mask and a reticle optical mask respectively, is cured so that those areas which have had light incident thereon become a tough polymer resistent to metal etching solution.

The metal layer 14 is etched leaving behind only those areas which are protected by the photoresist 16, i.e. leaving a pattern of metalisation on the now wafer scale integrated circuit on the substrate 10 which has been defined according to the present invention.

It is to be appreciated that the diffused areas 12 need not all be identical to one another, several different kinds of areas being possible provided that the local metalisation mask 18 is replaced by one mask for each of the different types of areas 12.

The order of step-and-repeat masking followed by reticle masking can be reversed and indeed the reticle masking can be performed amid the step-and-repeat masking process steps. The reticle masking process for the global lines can be performed in several successive stages.

What I claim is:

1. A method of metalizing a wafer scale integrated circuit having a plurality of integrated circuit areas on a common substrate with interconnection between said plurality of circuit areas, said method using a wafer scale integrated circuit initially having a layer of metalization and a layer of photoresist, the method comprising:

irradiating said photoresist layer through a step and repeat optical mask which will allow the through passage of radiation to only those areas of metalization for each of said plurality of integrated circuit areas, each said area of metalization having conductors, said photoresist being a negative photoresist irradiating said photoresist layer through a reticle optical mask which allows the through passage of radiation to define only global line areas of metalization for providing connection between said plurality of integrated circuit areas, said global lines connecting to said conductors, said reticle mask opaque in said plurality of integrated circuit areas; and, etching said irradiated wafer scale integrated circuit to leave a pattern of metal providing electrical connection for both said plurality of integrated circuit areas and the electrical connection between said integrated circuit areas.

* * * * *